United States Patent
Tsuchiya et al.

(10) Patent No.: US 6,961,244 B2
(45) Date of Patent: Nov. 1, 2005

(54) SWITCHING POWER SUPPLY

(75) Inventors: Takahiro Tsuchiya, Chuo-ku (JP); Ryoji Sunami, Chuo-ku (JP)

(73) Assignee: TDK Corporation, Tokyo (JP)

( * ) Notice: Subject to any disclaimer, the term of this patent is extended or adjusted under 35 U.S.C. 154(b) by 21 days.

(21) Appl. No.: 10/797,112

(22) Filed: Mar. 11, 2004

(65) Prior Publication Data

US 2004/0190318 A1 Sep. 30, 2004

(30) Foreign Application Priority Data

Mar. 26, 2003 (JP) ........................................ 2003-085709

(51) Int. Cl.[7] ................................................. H05K 5/20
(52) U.S. Cl. ...................... 361/710; 361/699; 361/702
(58) Field of Search ................................ 361/698, 699, 361/702, 710; 257/711, 714; 165/80.4

(56) References Cited

U.S. PATENT DOCUMENTS

| | | | | |
|---|---|---|---|---|
| 3,365,620 A | * | 1/1968 | Im et al. | ...................... 361/702 |
| 5,309,319 A | * | 5/1994 | Messina | ...................... 361/699 |
| 6,166,937 A | | 12/2000 | Yamamura et al. | |
| 6,305,463 B1 | * | 10/2001 | Salmonson | ................. 165/80.3 |
| 6,388,317 B1 | * | 5/2002 | Reese | ........................... 257/713 |
| 6,888,722 B2 | * | 5/2005 | Viswanath | .................... 361/704 |
| 2001/0014029 A1 | | 8/2001 | Suzuki et al. | |

FOREIGN PATENT DOCUMENTS

| | | |
|---|---|---|
| JP | 11-121690 | 4/1999 |
| JP | A 2000-13062 | 1/2000 |
| JP | 2000-014150 | 1/2000 |
| JP | A 2003-08264 | 1/2003 |

* cited by examiner

Primary Examiner—Bao Q. Vu
(74) Attorney, Agent, or Firm—Oliff & Berridge, PLC (57) ABSTRACT

A switching power supply includes a switching circuit, a main transformer, a rectifier circuit, and an output smoothing circuit, which are mounted on a base plate. Voltage transformation of an inputted direct current voltage is performed through collaboration among the above. A pedestal portion is formed on the base plate, and a channel to cool down electronic parts such as a diode is formed inside the pedestal portion. Since the channel is thus formed inside the pedestal portion, the device will not be larger-sized even when the channel is formed. Moreover, at least any of a switching element and a diode is mounted on the pedestal portion, and a choke coil is mounted in a region other than a region where the pedestal portion is formed. Therefore, even with the pedestal portion, it is significantly suppressed for the device to be larger-sized.

6 Claims, 6 Drawing Sheets

Fig.6

SWITCHING POWER SUPPLY

BACKGROUND OF THE INVENTION

1. Field of the Invention

The present invention relates to a switching power supply, and particularly to a switching power supply used as a DC—DC converter.

2. Related Background of the Invention

In recent years, there have been growing demands for energy saving and environmental conservation, and, as one of what reflect such demands, hybrid cars have been put into practical application. A hybrid car is a car that utilizes, as its power source, a conventional internal combustion engine and an electric motor (motor for a hybrid car) combined therein. The motor for a hybrid car is capable of recovering electric energy by performing power regeneration when the speed is reduced or the like. The regenerated power as well as power generated by utilizing outputs of the internal combustion engine are stored in a battery.

A voltage supplied from a battery is stepped down in a DC—DC converter to be distributed to on-vehicle equipment such as headlights. Moreover, the stepped down power is distributed also to the aforementioned motor for hybrid cars through an inverter. Such a DC—DC converter essentially includes: an input smoothing circuit for removing noises of an input voltage; a switching circuit for converting a direct current into an alternating current; a main transformer for stepping down a voltage; a rectifier circuit for converting an alternating current into a direct current; and an output smoothing circuit for removing noises of an output voltage. Among the circuits and the main transformer (hereinafter, referred to as "elements"), a switching circuit having a switching element such as a metal-oxide-semiconductor field-effect transistor (MOSFET), and a rectifier circuit having a semiconductor diode are heated up to have a temperature as high as a hundred and several dozen degrees Celsius when a converter is operated. Therefore, measures for releasing the heat are generally taken at least for these elements.

For example, in an electronic circuit device (switching power supply) disclosed in Japanese Patent Laid-Open No. 2000-13062, among regions in the base plate on which the aforementioned respective elements are mounted, radiator plates are provided in regions corresponding to the positions of the elements, thereby enhancing heat release from the hot elements. Note that, in this switching power supply, the heights of the elements are adjusted by positioning the radiator plates at different heights from one another.

However, with respect to the above switching power supply, although the space used for the device is reduced by adjusting the heights among the elements, there have been problems concerning the cooling capacity thereof. More specifically, in a switching power supply whose output is high enough (around 110A) for application to a hybrid car, the elements are not cooled down to a required and sufficient level only with the radiator plates attached to the elements. Thus, characteristics of the elements are deteriorated, and the elements may be broken in some cases. Therefore, in practice, a water-cooling method with a sufficient cooling capacity such as one disclosed in Japanese Patent Laid-Open 2003-08264 is adopted. That is, a method of suppressing excessive heating of the elements through the base plate is adopted. Here, radiator fins are provided on the opposite side of the element mounting surface of the base plate on which the respective elements are mounted, and coolant is flown between the radiator fins.

SUMMARY OF THE INVENTION

Generally, the space for installing an on-vehicle switching power supply is limited, and a smaller-sized switching power supply is therefore more preferable. However, with regard to the above-mentioned conventional switching power supply, the entire size of the device is increased by simply adding the sizes of the radiator fins and a casing for the radiator fins to the size of the switching power supply itself. Accordingly, a larger space is required to install such a switching power supply.

The present invention is made to solve the above problems, and an object thereof is to provide a smaller-sized switching power supply employing a water-cooling method.

A switching power supply according to the present invention includes: a switching element which constitutes a switching circuit for converting an input voltage from a direct current into an alternating current; a main transformer which performs voltage transformation on the input voltage converted into the alternating current by the switching circuit; a rectifier which constitutes a rectifier circuit for converting, from the alternating current into a direct current, the input voltage on which the voltage transformation is performed by the main transformer; and a choke coil which constitutes a smoothing circuit for filtering the input voltage converted into the direct current by the rectifier circuit, all of the switching element, the main transformer, the rectifier and the choke coil being mounted on a base plate. Here, the base plate includes a pedestal portion higher than surrounding regions, at least any of the switching element and the rectifier is mounted on the pedestal portion of the base plate, the choke coil is higher than the switching element and the rectifier and mounted in a region other than a region where the pedestal portion is formed within a region on the base plate, and a coolant channel through which coolant flows is formed inside the pedestal portion.

This switching power supply includes a switching circuit, a main transformer, a rectifier circuit, and an output smoothing circuit, which are mounted on a base plate. Voltage transformation of an inputted direct current voltage is performed through collaboration among the above. A pedestal portion is formed on the base plate, and a coolant channel to cool down electronic parts such as a rectifier is formed inside the pedestal portion. Since the coolant channel is thus formed inside the pedestal portion, enlargement of the device due to presence of the coolant channel is suppressed. Moreover, at least any of a switching element and a rectifier is mounted on the pedestal portion, and a choke coil is mounted in a region other than a region where the pedestal portion is formed. Therefore, the top of the switching element or the rectifier, whose heights are lower than the choke coil, is lifted when mounted on the pedestal portion. However, the height displacement of the switching element or the rectifier is offset by the height difference originally exists between the devices of the switching element or the rectifier and the choke coil. Hence, even with such a pedestal portion, it is significantly suppressed for the device to be larger-sized. In other words, according to this switching power supply, the enlargement of the device in the height direction of the electronic parts is suppressed as compared with the switching power supply to which radiator fins and a casing to enclose the radiator fins are simply attached. Thus, the device is made smaller.

Moreover, it is preferable that an opening portion is formed on a back side of the pedestal portion, and the coolant channel is defined by means of a channel sidewall integrally provided upright on the back side of the pedestal portion and of a cover plate which covers the opening portion. In this case, the coolant channel is formed of two parts of the cover plate and the base plate in which the channel sidewall is formed. Hence, the number of parts required for the formation of the coolant channel is reduced, and preparation process of the switching power supply is simple.

Further, it is preferable that, on the cover plate, an inlet pipe through which the coolant is flown into the coolant channel and an outlet pipe through which the coolant is flown out of the coolant channel, the inlet and outlet pipes extending in a normal direction of the cover plate, are integrally molded. In this case, water leakage in joint portions of the cover plate with the inlet and outlet pipes is suppressed. Moreover, when the inlet and outlet pipes are integrally molded to the cover plate by casting, demolding will be easy by releasing the mold in a direction of a normal of the cover plate.

Furthermore, it is preferable that a flange portion is formed at an end portion of each of the inlet and outlet pipes, and a step portion having a larger diameter than that of the flange portion is formed at a base of each of the inlet and outlet pipes. In this case, the life of the mold will be extended especially when the cover plate and the inlet and outlet pipes are integrally prepared by die-cast molding.

In addition, it is preferable that, when the outlet pipe is positioned vertically above the inlet pipe, the coolant channel in the vicinity of the outlet pipe is inclined upward relative to a horizontal direction. In this case, air is hardly stuck in the coolant channel in the vicinity of the outlet pipe.

Moreover, it is preferable that, when the outlet pipe is positioned vertically above the inlet pipe, the coolant channel is routed to have no flexure projecting vertically upward. In this case, air is hardly stuck in the coolant channel.

DESCRIPTION OF THE PREFERRED EMBODIMENT

A preferred embodiment of the present invention will be detailed hereinbelow with reference to the accompanying drawings. Note that the same reference numerals are applied to the same elements, and overlapping explanation thereof will be omitted.

Figure 1:
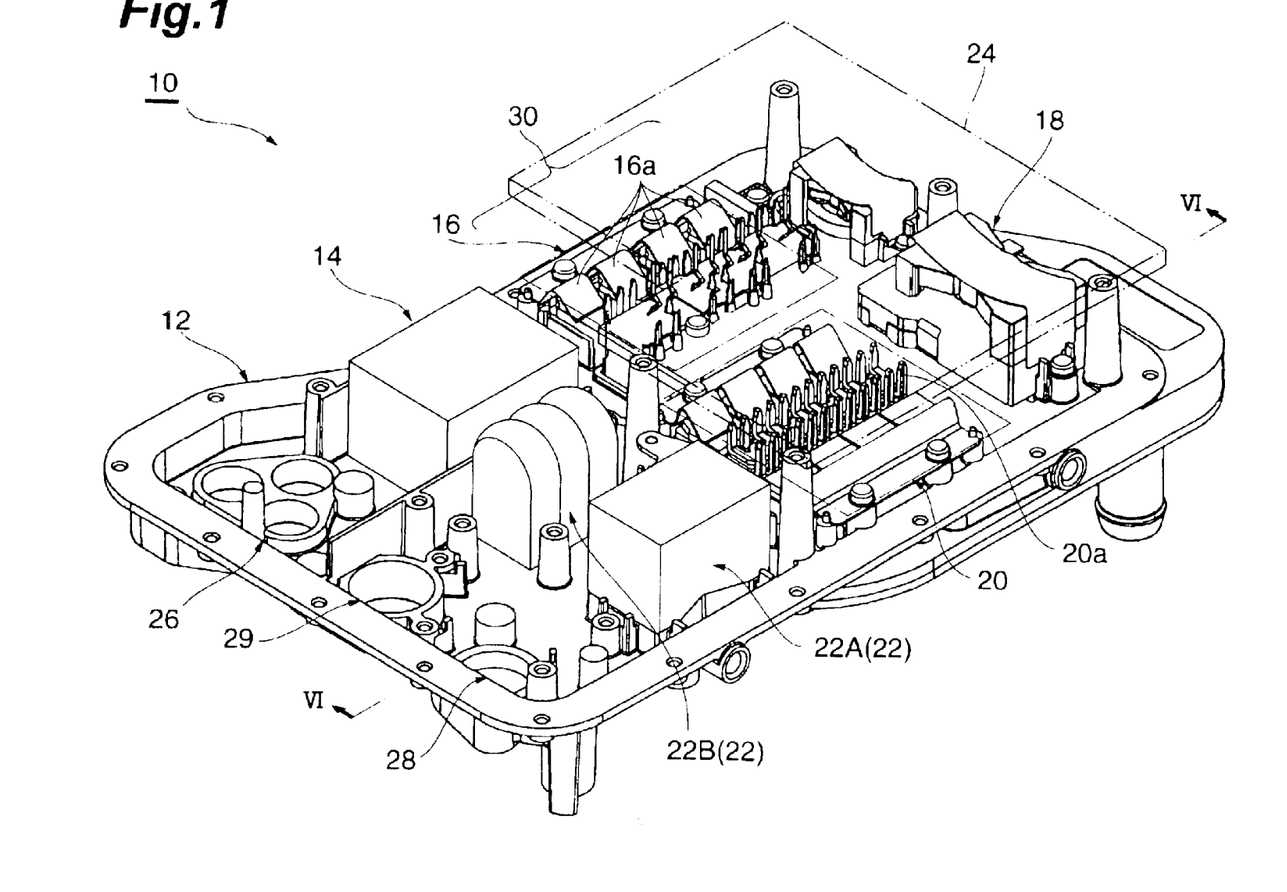
FIG. 1 is a perspective overview of a switching power supply according to an embodiment of the present invention.

FIG. 1 is a perspective overview of a switching power supply 10 according to an embodiment of the present invention. The switching power supply 10 is a so-called DC—DC converter applied to a hybrid car and the like, and is a device which steps down an input voltage sent from an on-vehicle battery, and stabilizes the voltage to send it out to on-vehicle equipment such as power windows, headlights, and audio equipment, as well as to a motor and the like.

The switching power supply 10 includes, as main components, a base plate 12, an input smoothing circuit 14 for removing noises of an input voltage, a switching circuit 16 for converting a direct current into an alternating current, a main transformer 18 which performs voltage transformation, a rectifier circuit 20 for converting an alternating current into a direct current, and an output smoothing circuit 22 for removing noises of an output voltage. Moreover, on the base plate, disposed is a control board 24 which mainly controls the switching circuit 16.

Figure 2:
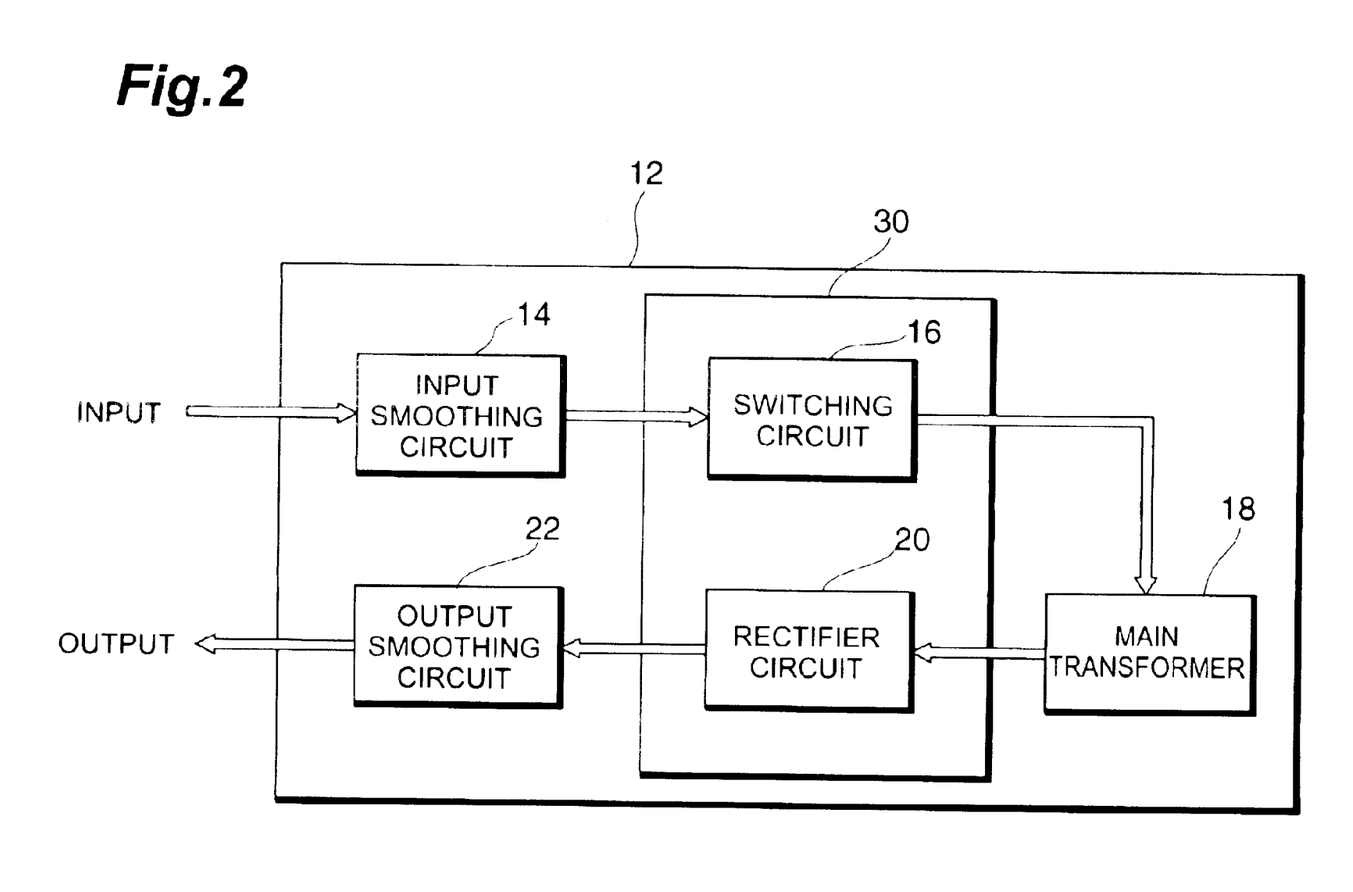
FIG. 2 is a diagram schematically showing a circuit system of the switching power supply of FIG. 1.

Relations among these components will be described with reference to FIG. 2. Note that FIG. 2 is a diagram schematically showing a circuit system of the switching power supply 10. As described above, when the switching power supply 10 receives an input voltage from a battery, noises of the input voltage are first removed in the input smoothing circuit 14. The input voltage, from which noises have been removed by the input smoothing circuit 14, is then converted into an alternating voltage in the switching circuit 16. The input voltage converted into an alternating voltage is stepped down in the main transformer 18. The stepped down input voltage is converted into a direct current in the rectifier circuit 20, and outputted after noises thereof are removed in the output smoothing circuit 22. Note that various circuits and elements other than the circuits and the elements shown in FIG. 2 are mounted on the switching power supply 10. However, they are omitted for convenience of explanation.

As shown in FIG. 1, all of the input smoothing circuit 14, switching circuit 16, main transformer 18, rectifier circuit 20, and output smoothing circuit 22 are mounted on the base plate 12. The input smoothing circuit 14 schematically shown essentially includes a coil and a capacitor, which are relatively large elements among those mounted on the base plate 12. The switching circuit 16 includes, for example, four switching elements 16a which are MOSFETs. The timing of connecting/disconnecting these switching elements 16a is controlled by the control board 24. To be more specific, two pairs of switching elements 16a are respectively connected/disconnected at a predetermined timing by the control board 24, whereby conversion from a direct current into an alternating current is performed. The main transformer 18 includes a primary coil with more windings and a secondary coil with less windings, and reduces (steps down) an input voltage.

The rectifier circuit 20 includes a plurality of diodes 20a as rectifiers. Note that, not only a chip of rectifier, but also a module of plural rectifiers can be counted as such a rectifier. The output smoothing circuit 22 essentially includes of a choke coil 22A and a capacitor 22B, which are relatively large elements among those mounted on the base plate 12.

On one end of the base plate 12, input cable holes 26, an output cable hole 28, and a signal cable hole 29 are provided, and, into these holes, unillustrated input cables, an output cable, and a signal cable are installed, respectively. Thus, the input cables and the output cable are gathered in one end of the base plate 12 and connected thereto. A voltage inputted from this end is turned at the main transformer 18 placed at the opposite end and returns back to the above end to be outputted therefrom. Moreover, between the input cable holes 26 and the main transformer 18, the input smoothing circuit 14 and the switching circuit 16 are disposed in this order when viewed from the input cable holes 26. Further, between the main transformer 18 and the output cable hole 28, the rectifier circuit 20 and the output smoothing circuit 22 are disposed in this order when viewed from the main transformer 18. The region including the switching circuit 16 and the rectifier circuit 20 within the surface region of the base plate 12 is a pedestal portion 30 higher than surrounding regions thereof. The switching elements 16a of the switching circuit 16 as well as the diodes 20a of the rectifier circuit 20 are disposed on the pedestal portion 30 (refer to FIG. 6).

Figure 3:
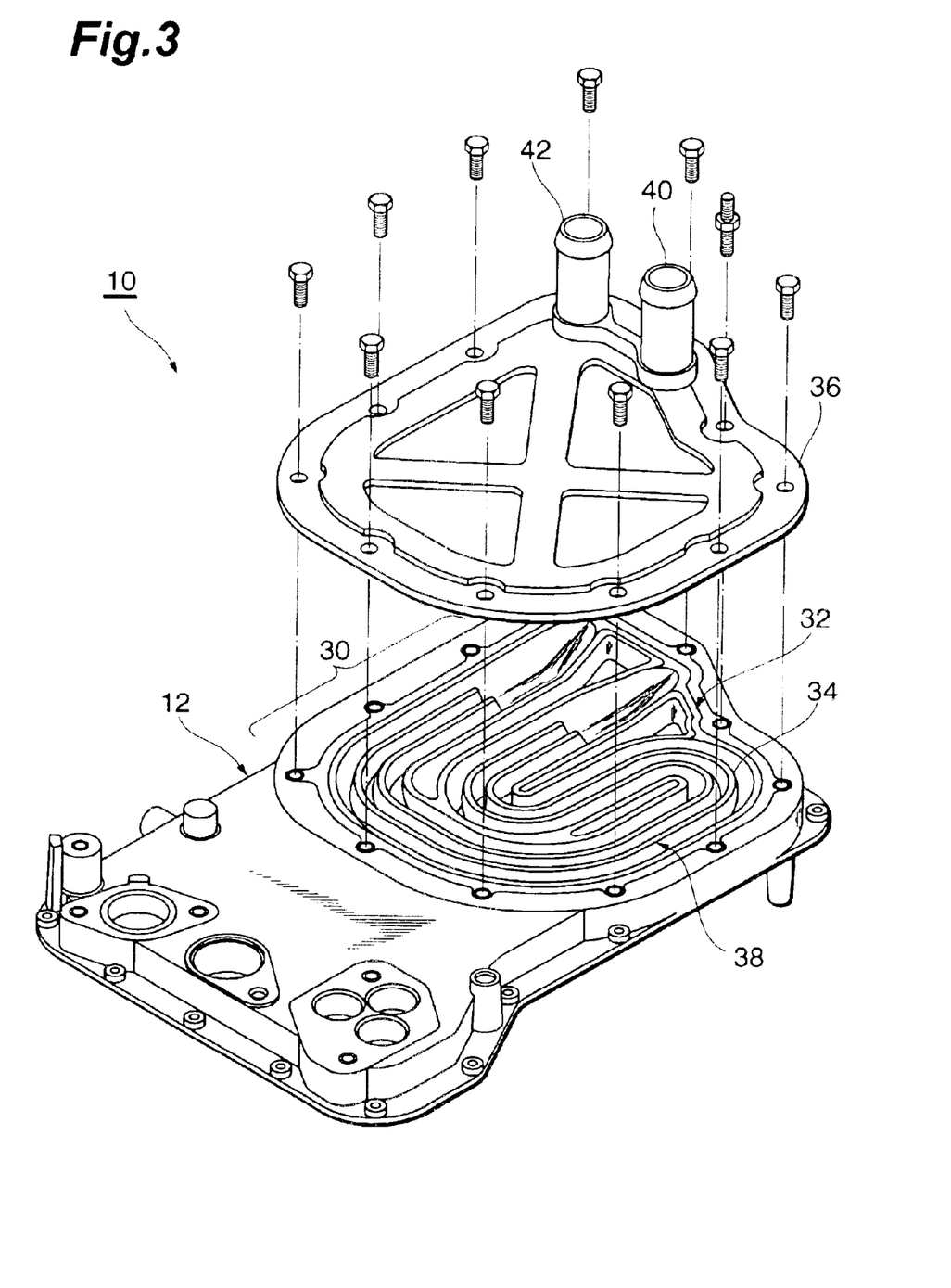
FIG. 3 is a perspective view of the opposite side of a base plate shown in FIG. 1.

Next, with reference to FIG. 3, a description will be given of a channel formed on the back side of the base plate 12, the side being the opposite of the side shown in FIG. 1. As shown in FIG. 3, the back side of the region where the pedestal portion 30 is formed is recessed, and in this recessed portion 32, a plurality of flexuous fins (channel sidewalls) 34 are integrally provided upright. The fins 34 are provided such that a flow of cooling water is branched into three. In addition, the fins 34 have a plurality of flexures. Therefore, the cooling water (coolant) is thoroughly flown within the recessed portion 32.

Moreover, on the back side of the base plate 12, a flat cover plate 36 is attached by use of screws such that the opening portion of the recessed portion 32 is covered. The cover plate 36 is attached to the end portions of the fins 34 in the recessed portion 32 without a space, and a channel (coolant channel) 38 is defined by the cover plate 36 and the recessed portion 32. On the cover plate 36, an inlet pipe 40 through which cooling water is flown into the channel 38, and an outlet pipe 42 through which cooling water is flown out of the channel 38, are integrally molded. The inlet pipe 40 and the outlet pipe 42 are extended in a direction of a normal of the cover plate 36, and hoses (not shown) are attached to the ends thereof.

Figure 4:
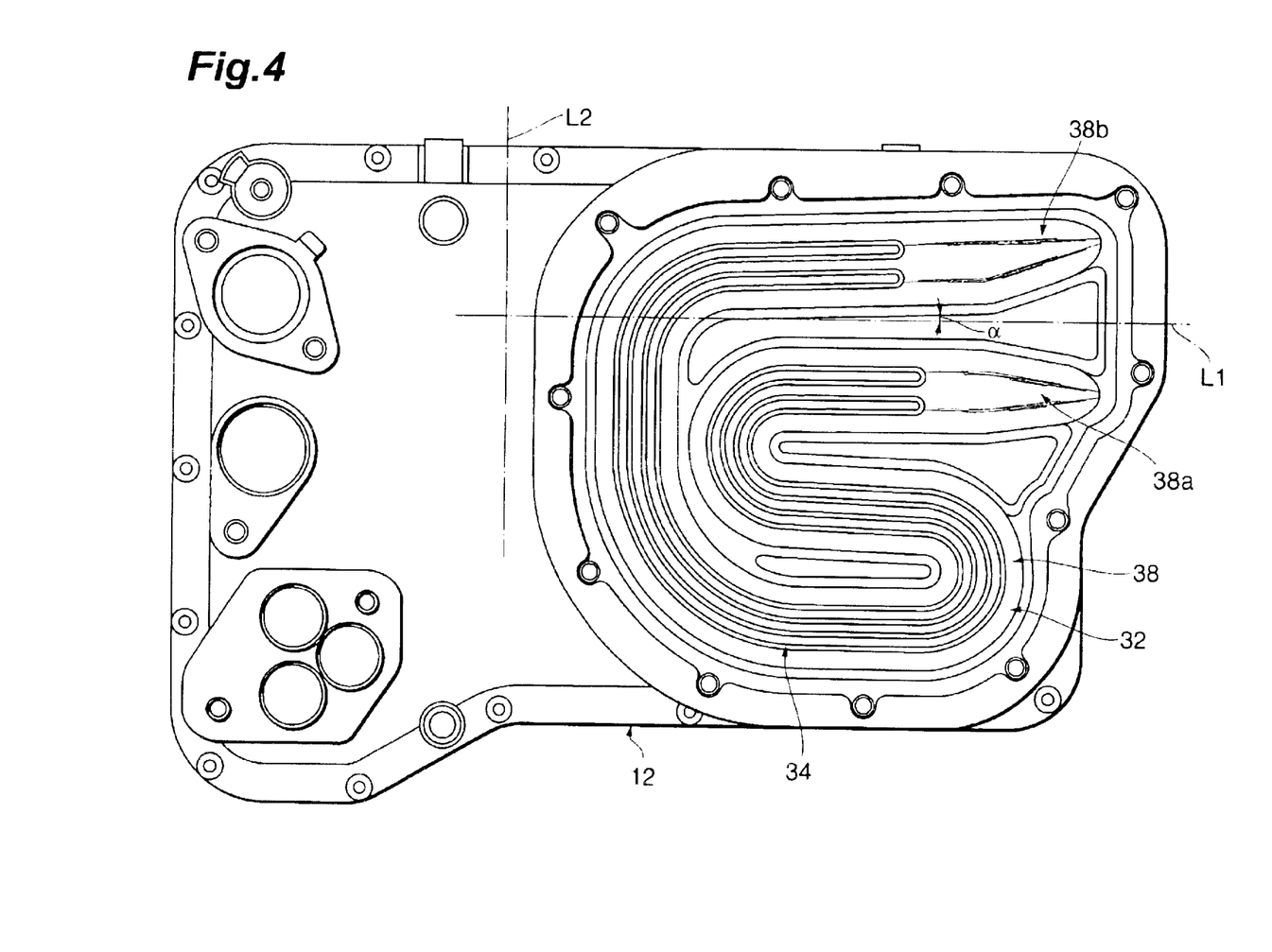
FIG. 4 is a plan view of a channel of FIG. 3.

Here, a description will be given of routing of the channel 38 with reference to FIG. 4. FIG. 4 is a plan view of the channel 38. With regard to this channel 38, cooling water flows in from an inlet portion 38a corresponding to the position of the inlet pipe 40, passes through the plurality of flexures, and flows out from an outlet portion 38b corresponding to the position of the outlet pipe 42. When mounted in a car, the base plate 12 is disposed vertically with the outlet portion 38b up and the inlet portion 38a down. A horizontal axis at this time is an axis parallel to a line L1 shown in the drawing. As it is clear from comparison between the direction of the channel 38 in the vicinity of the outlet portion 38b and that of the line L1, the channel 38 in the vicinity of the outlet portion 38b is inclined upward by an angle α relative to the horizontal axis. There are cases where bubbles contained in the cooling water flowing though the channel 38 stay in the vicinity of the outlet portion 38b and air is stuck therearound. However, with the channel 38 inclined in the vicinity of the outlet portion 38b, bubbles in the cooling water hardly stay therearound, and accordingly, air is not stuck easily. Thus, a portion with stuck air, which remarkably decreases cooling efficiency, is reduced, thereby enabling cooling with high efficiency even in the vicinity of the outlet portion 38b.

Moreover, the channel 38 is routed to have no flexure projecting vertically upward. In other words, the channel 38 is routed such that, in a direction of a plane of the sheet where FIG. 4 is shown, the direction being perpendicular to the line L1 (direction along a line L2 of FIG. 4), there is no turning where an upward flow changes to a downward flow. In the channel having a turning where an upward flow changes to a downward flow, bubbles are apt to stay in the turning. Accordingly, when there is no such a turning as in the case of the channel 38, bubbles in the cooling water hardly stay, and therefore, air is not stuck easily. Thus, a portion with stuck air, which remarkably decreases cooling efficiency, is reduced, and the entire channel 38 is cooled with high cooling efficiency.

Figure 5:
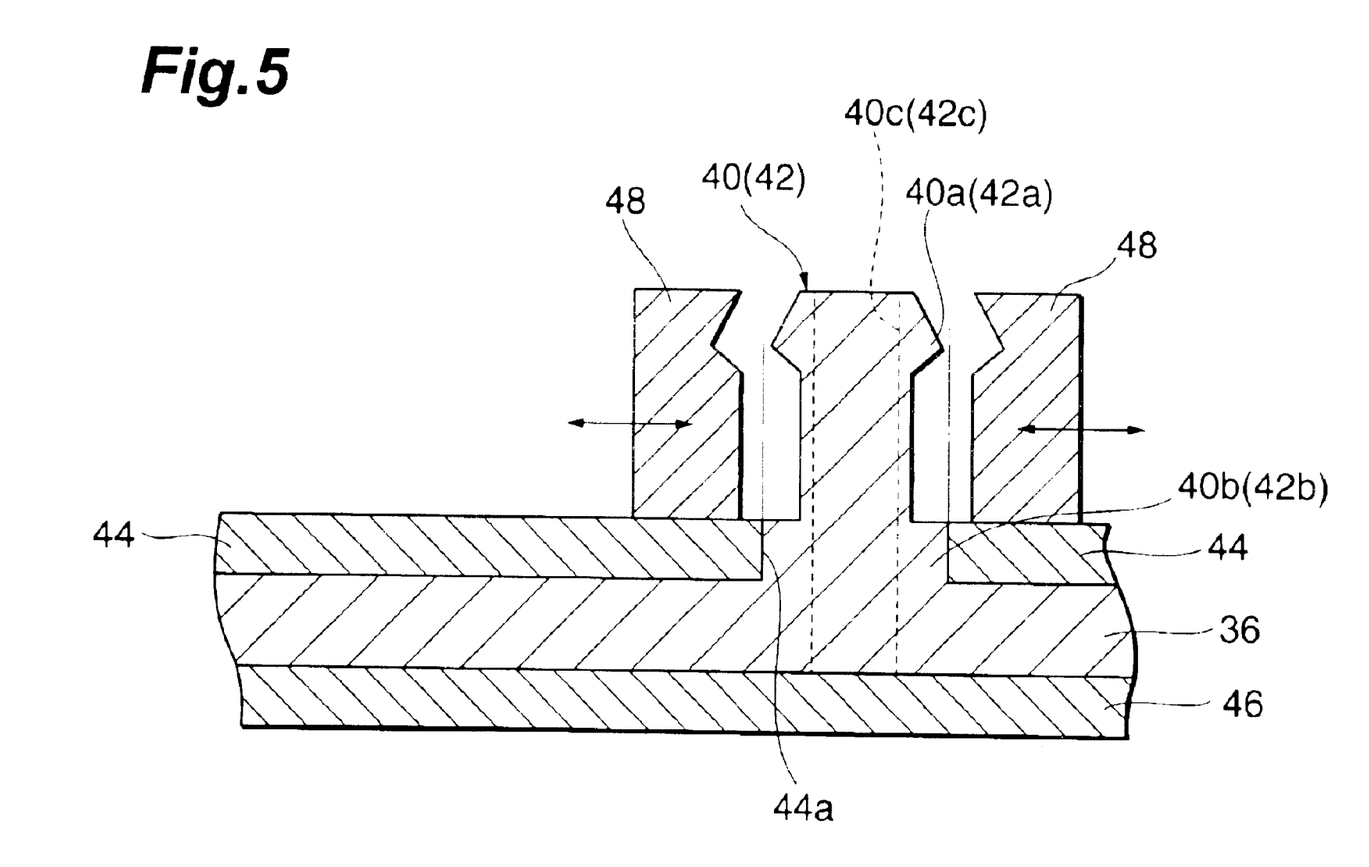
FIG. 5 is an enlarged sectional view of substantial parts which shows a state when a cover plate is prepared.

Next, with reference to FIG. 5, a description will be given of a method of preparing the cover plate 36 on which the inlet pipe 40 and the outlet pipe 42 are integrally molded. FIG. 5 is an enlarged sectional view of substantial parts which shows a state when the cover plate 36 is prepared. The cover plate 36 is prepared by die-cast molding. In the die-cast molding, an upper die 44, a lower die 46, and a pair of slide dies 48, 48 are used. Concerning the cover plate 36, flange portions 40a and 42a are formed at the end portions of the inlet pipe 40 and the outlet pipe 42, respectively, to prevent the hoses from dropping off. Therefore, an ordinary method using two dies of upper die and lower die is not capable of demolding the flange portions 40a and 42a without difficulty.

Hence, in addition to the upper die 44 having a hole 44a with a diameter larger than those of the flange portions 40a and 42a and to the lower die 46, the pair of slide dies 48, 48 is used to prepare the cover plate 36. More specifically, on top of the upper die 44, the pair of slide dies 48, 48 is slidably disposed to sandwich the inlet pipe 40 and the outlet pipe 42. Molten metal is poured in a region sandwiched by the upper die 44, lower die 46, and slide dies 48, 48 to integrally mold the cover plate 36 having the pipes 40 and 42 provided with the flange portions 40a and 42a, respectively. Thereafter, the slide dies 48, 48 are slid in plane directions of the cover plate 36 so that the pipes 40 and 42 are demolded. Further, the lower die 46 and the upper die 44 with the slide dies 48, 48 are released from the cover plate 36. Since the diameter of the hole 44a is larger than those of the flange portions 40a and 42a, the upper die 44 is easily released from the cover plate 36. Finally, holes 40c and 42c are pierced through the pipes 40 and 42, respectively, whereby the preparation of the cover plate 36 is completed.

When the cover plate 36 is integrally molded in this way, water leakage in joint portions of the cover plate 36 with the pipes 40 and 42 is suppressed. In addition, when the pipes 40 and 42 are extended in a direction of a normal of the cover plate 36, the upper die 44 is easily released. Thus, molding of such pipes is easier than molding of pipes extending in a plane direction of the cover plate 36. Moreover, according to the aforementioned preparation method, step portions 40b and 42b with the same thicknesses as that of the upper die 44 are formed at the bases of the pipes 40 and 42, respectively. Therefore, abrasion of the slide molds 48, 48 is reduced as compared with a case where a mold is used in which the slide molds 48, 48 slide directly on the cover plate 36. As a result, the life of the mold is extended.

Figure 6:
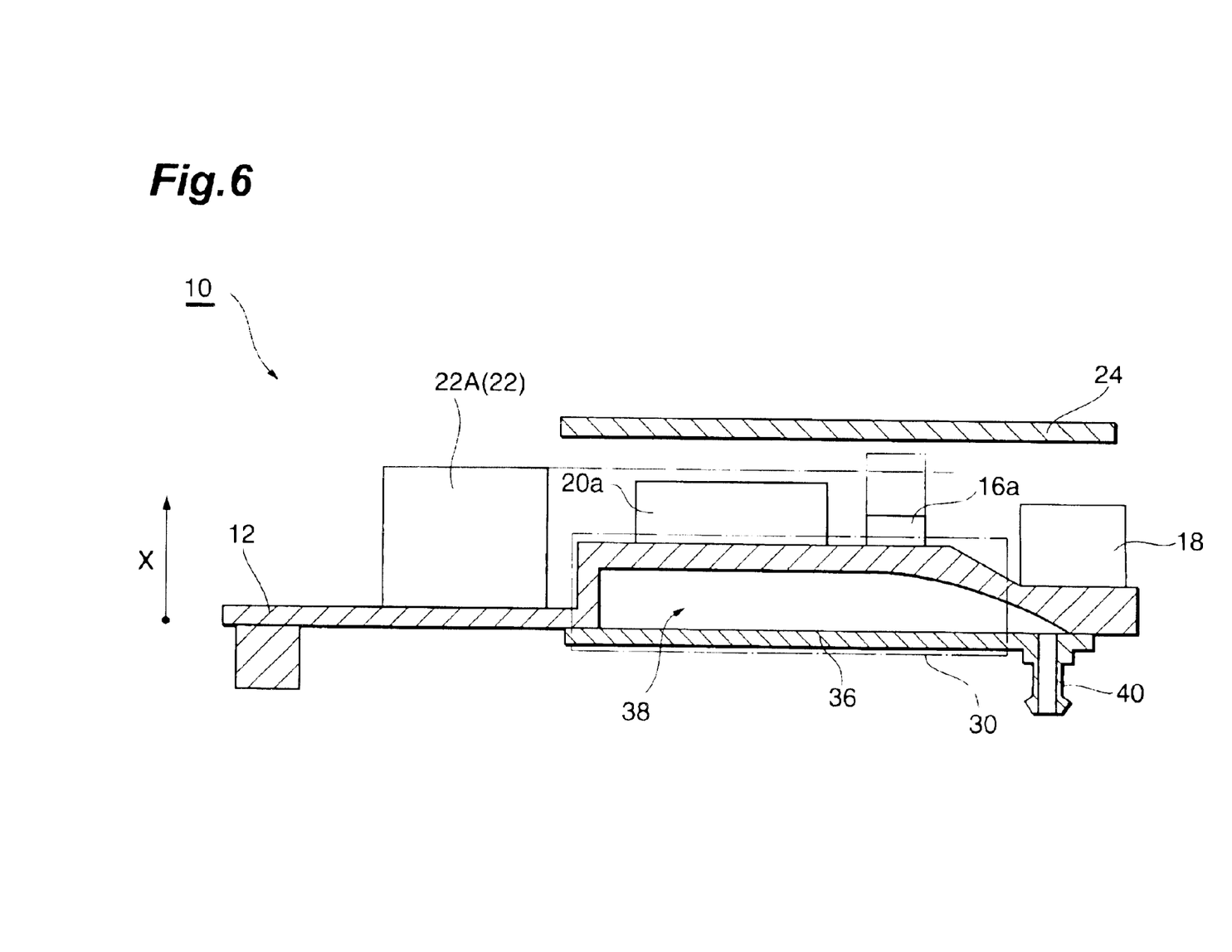
FIG. 6 is a schematic sectional view of a cross-section taken along a VI—VI line of FIG. 1.

Next, a description will be given of a sectional structure of the switching power supply 10 with reference to FIG. 6. FIG. 6 is a schematic sectional view of a cross-section taken along a VI—VI line of FIG. 1. As described above, on the pedestal portion 30 of the base plate 12, the switching elements 16a and the diodes 20a are mounted. Moreover, the channel 38 is formed in a region substantially corresponding to the pedestal portion 30. In other words, the base plate 12 is recessed at a portion upheaved due to the formation of the pedestal portion 30, and the channel 38 is formed within the recessed portion 32. Cooling water is introduced into this channel 38 from the inlet pipe 40, and therefore, heat release is enhanced mainly around the diodes 20a and the switching elements 16a mounted on the pedestal portion 30. Note that, when cooling water is introduced, heat release from the main transformer 18, choke coil 22A, and capacitor 22B is also enhanced.

As has been detailed above, the channel 38 is formed inside the pedestal portion 30, and thus the space required to form the channel 38 is significantly saved. As a result, enlargement of the switching power supply 10 due to the presence of the channel 38 is suppressed. Moreover, the switching elements 16a and the diodes 20a, the heights of which are relatively low among the electronic parts mounted on the base plate 12, are mounted over the channel 38. This means that, even when they are lifted while being mounted on the pedestal portion 30, the tops of the switching elements 16a and the diodes 20a are positioned lower than that of the choke coil 22A (refer to the alternate long and short dashed line of FIG. 6). Therefore, the switching power supply 10 will not be extended in the height direction of the electronic parts (X direction of FIG. 6). Thus, according to the switching power supply 10, the device is smaller-sized as compared with a switching power supply to which radiator fins and a casing to enclose the radiator fins are simply attached.

Moreover, the channel 38 is formed of two parts of a cover plate and a base plate in which fins are integrally molded. Since the number of parts thereof is small, preparation process of the switching power supply 10 is simple.

Note that, for example, even when the top of the switching element 16a is lifted upon mounting on the pedestal portion 30 to be higher than that of the choke coil 22A (refer to the alternate long and two short dashes line of FIG. 6), the lifted amount of the switching element 16a is offset by the original height difference between the switching element 16a and the choke coil 22A. Thus, also in the above case, enlargement of the switching power supply 10 in the height direction of the electronic parts is suppressed, and the device is therefore smaller-sized. Further, also when the tops of the switching element 16a and the choke coil 22A are positioned at the same height level when the switching element 16a is mounted on the pedestal portion 30 and lifted up, the lifted amount of the switching element 16a is offset by the original height difference between the switching element 16a and the choke coil 22A. Thus, enlargement of the switching power supply 10 in the height direction of the electronic parts is suppressed, and the device is therefore smaller-sized.

In the aforementioned embodiment, a mode has been illustrated as a preferred mode where both of the switching element 16a and the diode 20a, which are electronic parts whose heights are low, are mounted on the pedestal portion 30. However, it goes without saying that, because of the reasons described above, the switching power supply 10 can be smaller-sized even in a case where either of the switching element 16a or the diode 20a is mounted on the pedestal portion 30.

The present invention is not limited to the foregoing embodiment, and various modifications can be made therefor. For example, the switching power supply is not limited to a switching power supply for hybrid cars, and may be one to be applied to a large-scale computer such as a supercomputer. Moreover, the coolant is not limited to cooling water, and may be an antifreeze liquid, air, or the like.

As described above, according to the present invention, a smaller-sized switching power supply employing a water-cooling method is provided.

The basic Japanese Application No. 2003-085709 filed on Mar. 26, 2003 is hereby incorporated by reference.

What is claimed is:

1. A switching power supply, comprising:

a switching element which constitutes a switching circuit for converting an input voltage from a direct current into an alternating current;

a main transformer which performs voltage transformation on the input voltage converted into the alternating current by the switching circuit;

a rectifier which constitutes a rectifier circuit for converting, from the alternating current into a direct current, the input voltage on which the voltage transformation is performed by the main transformer; and a choke coil which constitutes a smoothing circuit for filtering the input voltage converted into the direct current by the rectifier circuit, all of the switching element, the main transformer, the rectifier and the choke coil being mounted on a base plate, wherein the base plate includes a pedestal portion higher than surrounding regions thereof, at least any of the switching element and the rectifier is mounted on the pedestal portion of the base plate, the choke coil is higher than the switching element and the rectifier, and mounted in a region other than a region where the pedestal portion is formed within a region on the base plate, and a coolant channel through which coolant flows is formed inside the pedestal portion.

2. The switching power supply according to claim 1, wherein an opening portion is formed on a back side of the pedestal portion, and the coolant channel is defined by means of a channel sidewall integrally provided upright on the back side of the pedestal portion and of a cover plate which covers the opening portion.

3. The switching power supply according to claim 1, wherein, on the cover plate, an inlet pipe through which the coolant is flown into the coolant channel and an outlet pipe through which the coolant is flown out of the coolant channel, the inlet and outlet pipes extending in a normal direction of the cover plate, are integrally molded.

4. The switching power supply according to claim 3, wherein a flange portion is formed at an end portion of each of the inlet pipe and the outlet pipe, and a step portion having a larger diameter than that of the flange portion is formed at a base of each of the inlet pipe and the outlet pipe.

5. The switching power supply according to claim 3, wherein, when the outlet pipe is positioned vertically above the inlet pipe, the coolant channel in the vicinity of the outlet pipe is inclined upward relative to a horizontal direction.

6. The switching power supply according to claim 3, wherein, when the outlet pipe is positioned vertically above the inlet pipe, the coolant channel is routed to have no flexure projecting vertically upward.

* * * * *